(12) United States Patent
Lu et al.

(10) Patent No.: US 12,513,883 B2
(45) Date of Patent: Dec. 30, 2025

(54) DRAM STRUCTURE AND METHOD FOR FORMING SAME

(71) Applicant: CHANGXIN MEMORY TECHNOLOGIES, INC., Hefei (CN)

(72) Inventors: Jingwen Lu, Hefei (CN); Xiaoling Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 624 days.

(21) Appl. No.: 17/955,630

(22) Filed: Sep. 29, 2022

(65) Prior Publication Data

US 2023/0027276 A1 Jan. 26, 2023

Related U.S. Application Data

(63) Continuation of application No. PCT/CN2022/070684, filed on Jan. 7, 2022.

(30) Foreign Application Priority Data

Sep. 13, 2021 (CN) .......................... 202111067349.3

(51) Int. Cl.
  *H10B 12/00* (2023.01)
(52) U.S. Cl.
  CPC ........... *H10B 12/053* (2023.02); *H10B 12/34* (2023.02)
(58) Field of Classification Search
  CPC ...... H10B 12/05; H10B 12/053; H10B 12/31; H10B 12/34; H10D 30/6728; H01L 21/764
  See application file for complete search history.

(56) References Cited

U.S. PATENT DOCUMENTS

| | | | |
|---|---|---|---|
| 9,484,335 B2 | 11/2016 | Cho | |
| 10,396,073 B2 | 8/2019 | Feng | |
| 10,424,586 B2 | 9/2019 | Yen | |
| 10,431,679 B2 | 10/2019 | Chang | |
| 2014/0061850 A1 | 3/2014 | Cho et al. | |
| 2014/0151777 A1 | 6/2014 | Sim et al. | |
| 2014/0175538 A1* | 6/2014 | Kang | H01L 21/764 257/329 |
| 2018/0197868 A1 | 7/2018 | Lin et al. | |
| 2018/0323190 A1 | 11/2018 | Feng et al. | |
| 2018/0342613 A1 | 11/2018 | Chang et al. | |
| 2018/0358362 A1 | 12/2018 | Yen et al. | |
| 2019/0333913 A1 | 10/2019 | Feng et al. | |
| 2019/0341487 A1 | 11/2019 | Chang et al. | |
| 2020/0203351 A1 | 6/2020 | Chae et al. | |

(Continued)

FOREIGN PATENT DOCUMENTS

| | | |
|---|---|---|
| CN | 104465354 A | 3/2015 |
| CN | 105576027 A | 5/2016 |
| CN | 103855166 B | 10/2016 |

(Continued)

*Primary Examiner* — Nelson Garces
(74) *Attorney, Agent, or Firm* — Syncoda LLC; Feng Ma

(57) ABSTRACT

A semiconductor structure and a method for forming the same are provided. The method for forming the semiconductor structure includes: providing a substrate; etching the substrate to form multiple active areas, trenches each positioned between adjacent active areas, and air gaps positioned below the active areas; and forming a filler layer filling at least each of the trenches.

17 Claims, 29 Drawing Sheets

(56) References Cited

U.S. PATENT DOCUMENTS

2021/0074334 A1    3/2021  Zhu

FOREIGN PATENT DOCUMENTS

| CN | 111354726 A | 6/2020 |
| CN | 111564442 A | 8/2020 |
| CN | 111900164 A | 11/2020 |
| CN | 113871343 A | 12/2021 |

* cited by examiner

DRAM STRUCTURE AND METHOD FOR FORMING SAME

CROSS-REFERENCE TO RELATED APPLICATIONS

This is a continuation of International Patent Application No. PCT/CN2022/070684, filed on Jan. 7, 2022, which claims priority to Chinese Patent Application No. 202111067349.3, filed on Sep. 13, 2021 and entitled "SEMICONDUCTOR STRUCTURE AND METHOD FOR FORMING SAME". The disclosures of International Patent Application No. PCT/CN2022/070684 and Chinese Patent Application No. 202111067349.3 are hereby incorporated by reference in their entireties.

BACKGROUND

DRAM (Dynamic Random Access Memory) is a semiconductor device commonly used in electronic devices, for example, computers. The DRAM includes multiple memory cells, each of which usually includes transistors and capacitors. Gate electrodes of the transistors are electrically connected to word lines, source electrodes of the transistors are electrically connected to bit lines, and drain electrodes of the transistors are electrically connected to the capacitors. The word line voltage of the word lines may be configured to control the turning on and off of the transistors, therefore data information stored in the capacitors can be read or written into the capacitors through the bit lines.

In a semiconductor structure such as the DRAM, each active area overlaps two word lines (i.e., the two word lines pass through the same active area). When one word line is activated and refresh repeatedly, the following two effects would be caused: on the one hand, noise or interference would be made to the other word line passing through the same active area; and on the other hand, before the active area adjacent to the activated word line is activated or refreshed, if the activated word line is refreshed too frequently, the active area adjacent to the activated word line would become fragile, resulting in charge loss or leakage problems. The two above mentioned effects would cause data errors in one or more active areas adjacent to the activated word line, resulting in the so-called row hammer effect.

Therefore, how to reduce the row hammer effect, reduce mutual interference between adjacent active areas, and improve the yield and performance reliability of the semiconductor structure is now an urgent technical problem to be solved.

SUMMARY

The disclosure relates to the technical field of semiconductor manufacturing, in particular to a semiconductor structure and a method for forming the same.

According to a first aspect of the disclosure, there is provided a method for forming a semiconductor structure, including the following operations.

A substrate is provided.

The substrate is etched to form multiple active areas, trenches each positioned between adjacent active areas, and air gaps positioned below the active areas.

A filler layer filling at least each of the trenches is formed.

According to a second aspect of the disclosure, there is provided a semiconductor structure, including: a substrate; multiple active areas; air gaps and a filler layer.

The multiple active areas are positioned on the substrate, and there are provided trenches each positioned between adjacent active areas.

The air gaps are positioned below the active areas.

The filler layer fills each of the trenches.

DETAILED DESCRIPTION

The specific implementations of a semiconductor structure and a method for forming the same provided by the disclosure will be described in detail with reference to the drawings.

Figure 1:
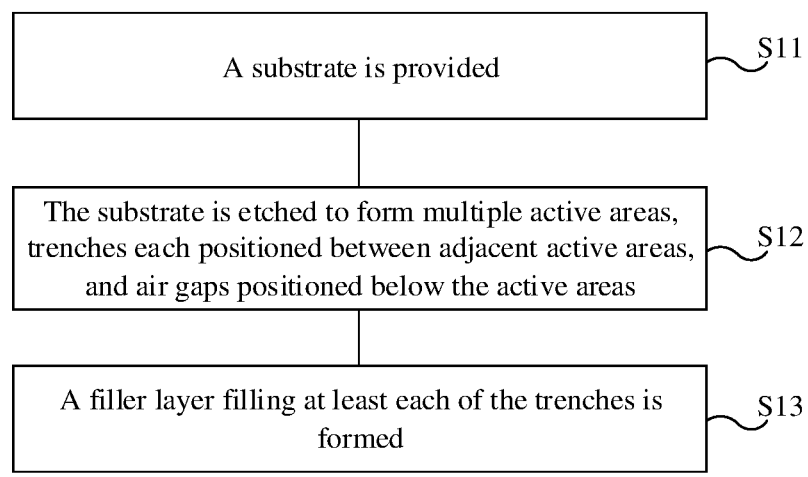
FIG. 1 illustrates a flow diagram of a method for forming a semiconductor structure in a specific implementation of the disclosure.
Figure 2A:
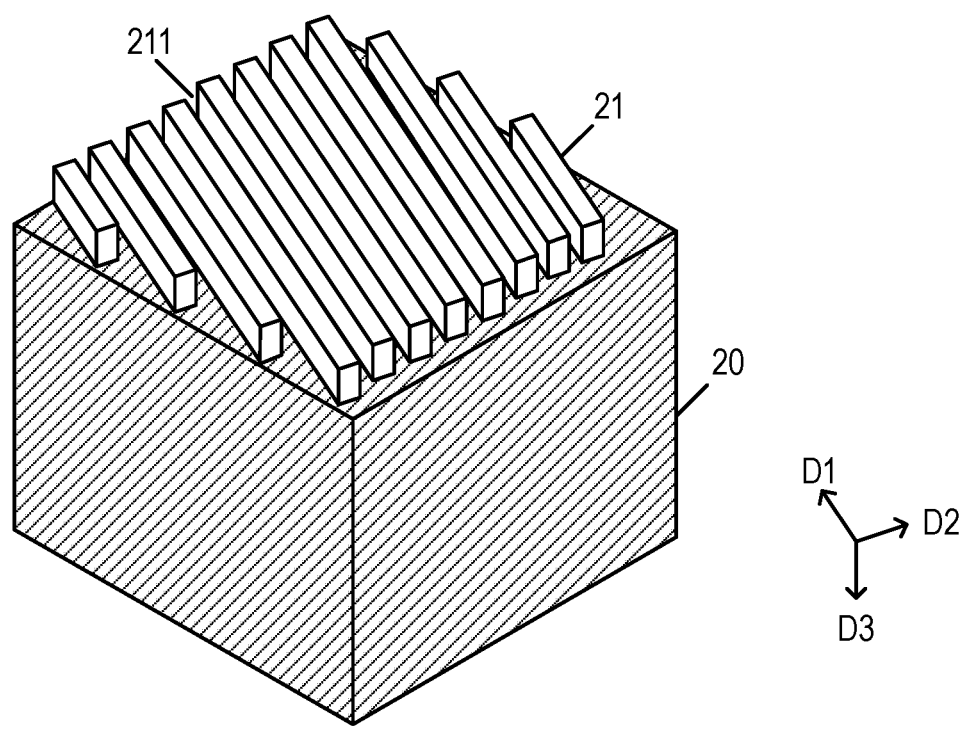
FIGS. 2A to 2X illustrate schematic diagrams of main process sections in forming a semiconductor structure in a specific implementation of the disclosure.
Figure 2B:
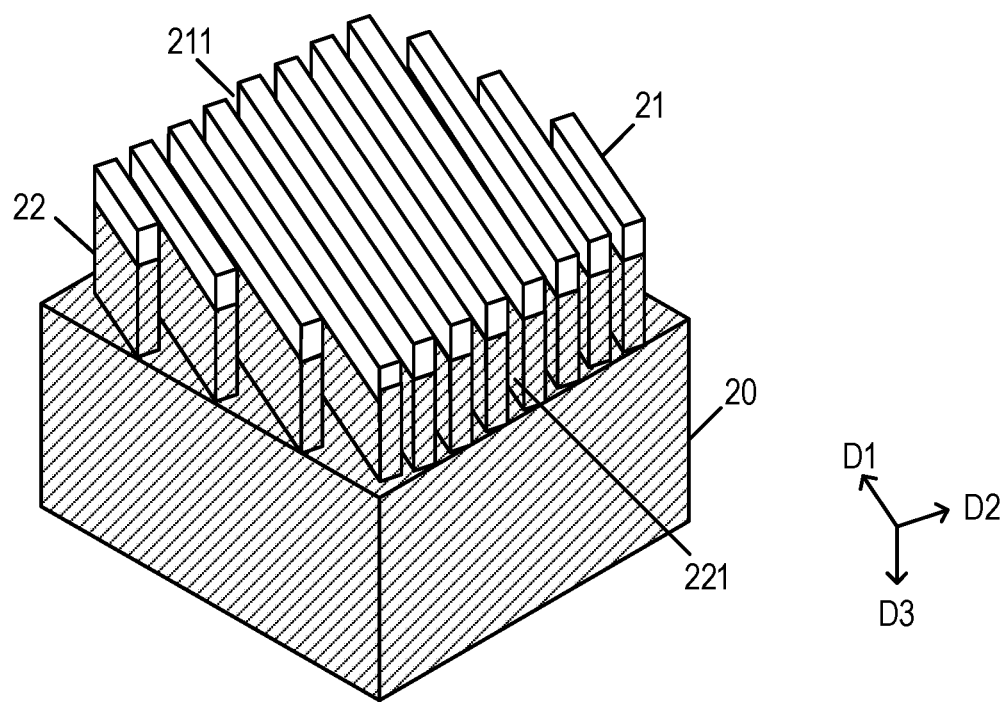
Figure 2C:
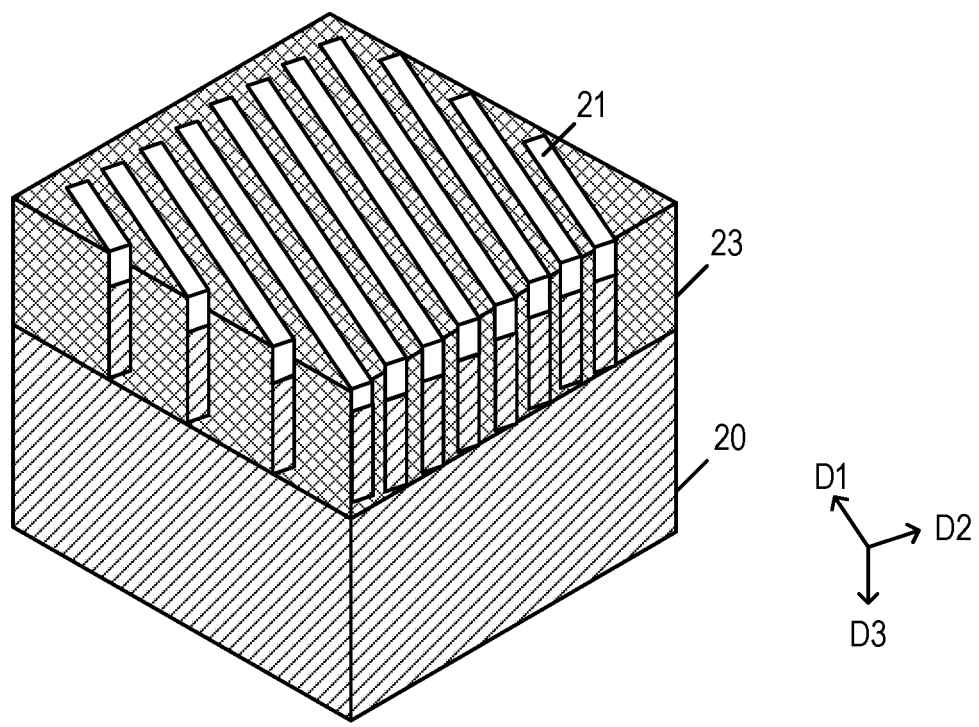
Figure 2D:
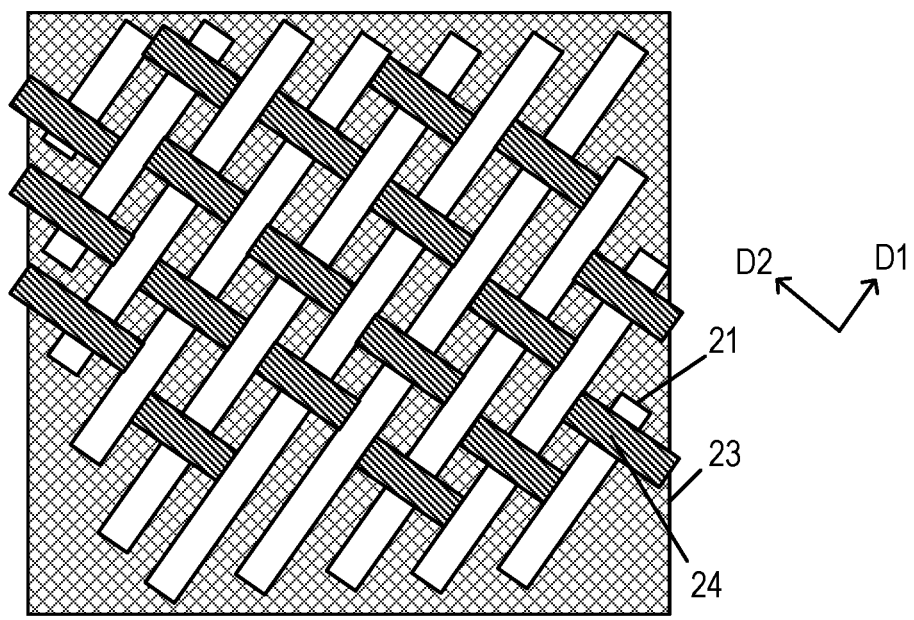
Figure 2E:
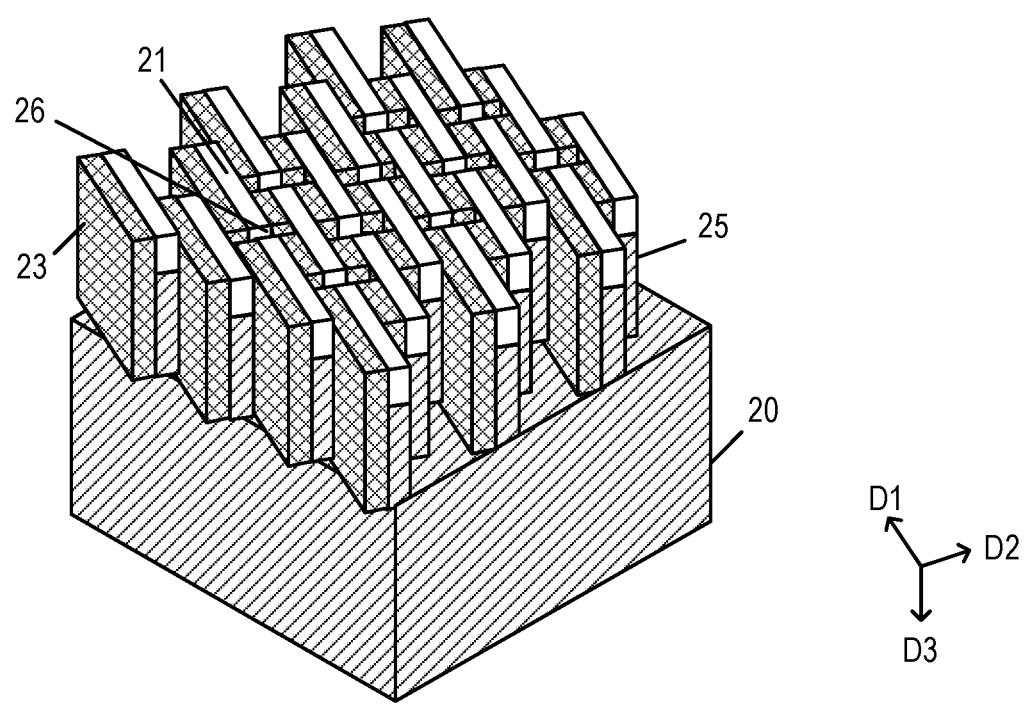
Figure 2F:
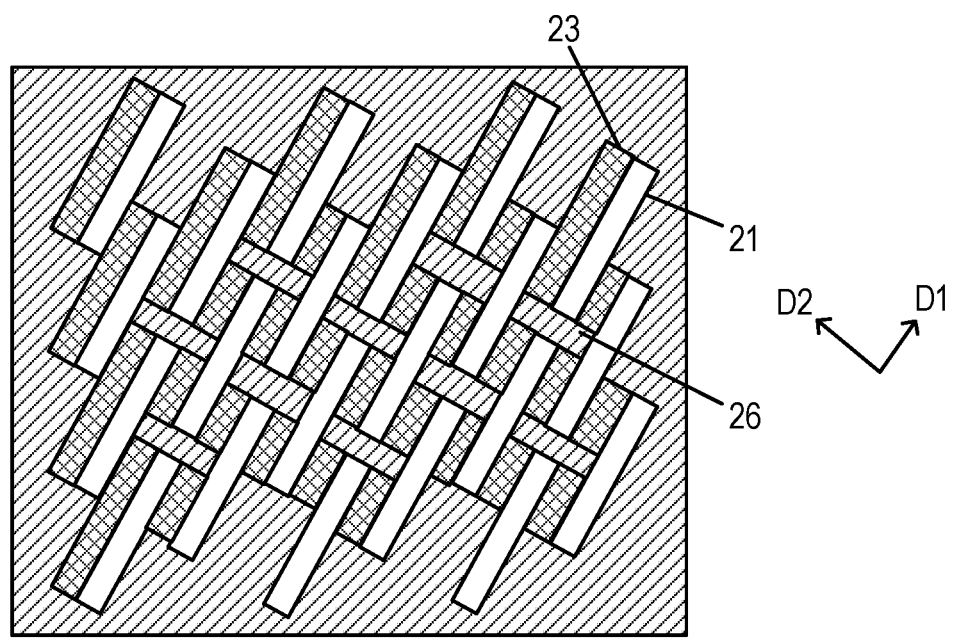
Figure 2G:
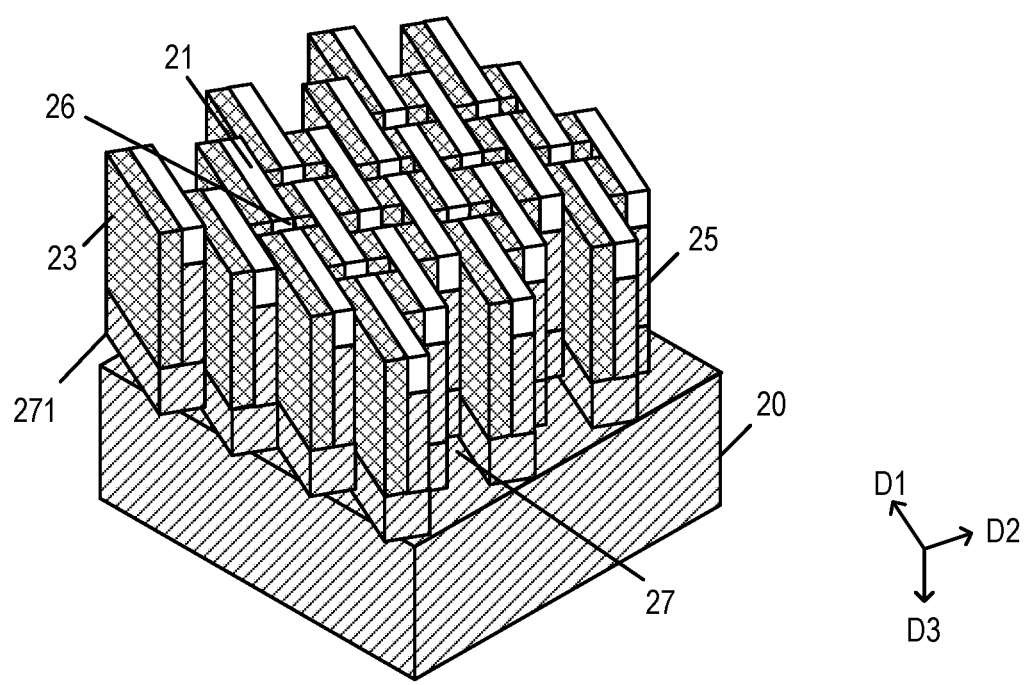
Figure 2H:
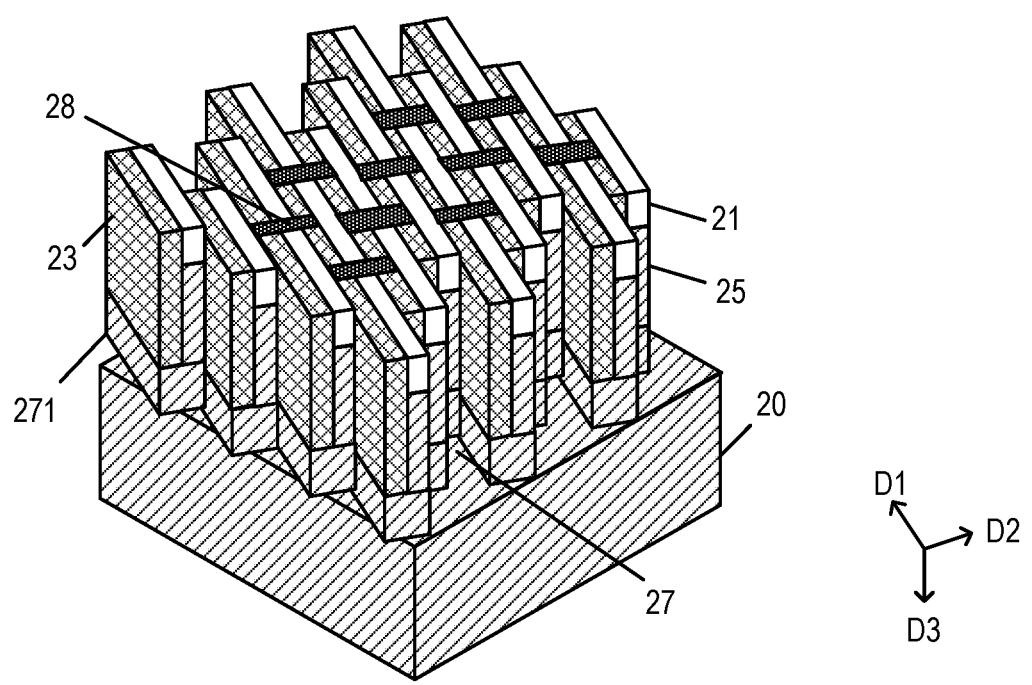
Figure 2I:
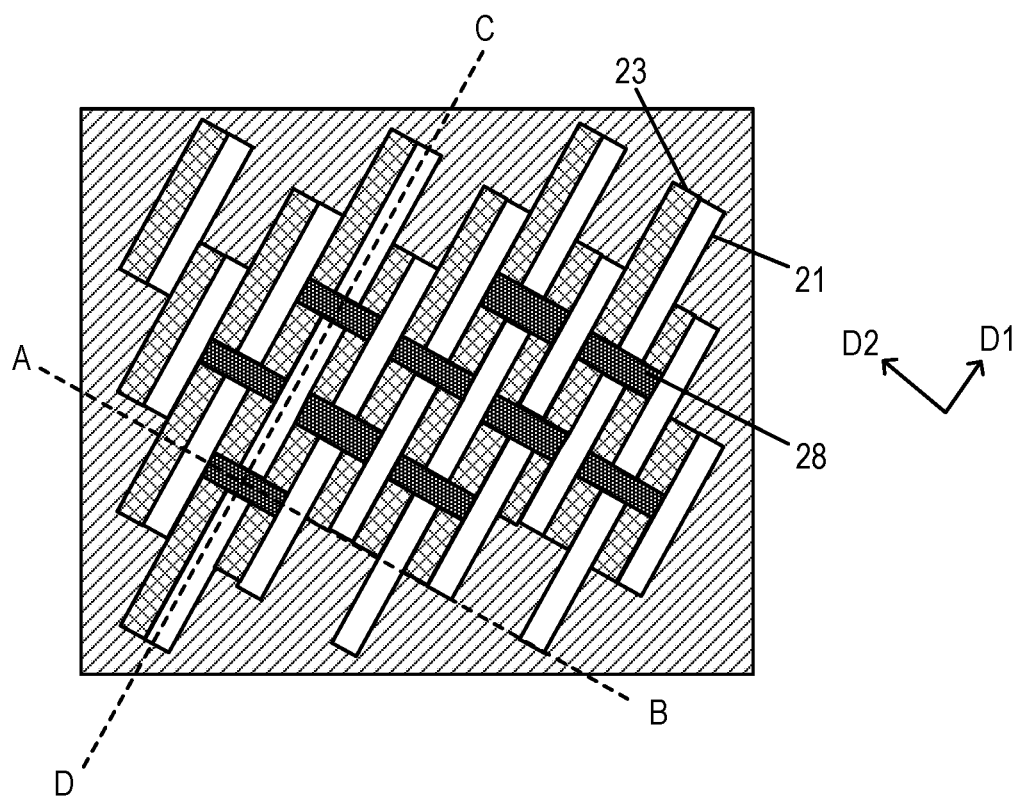
Figure 2J:
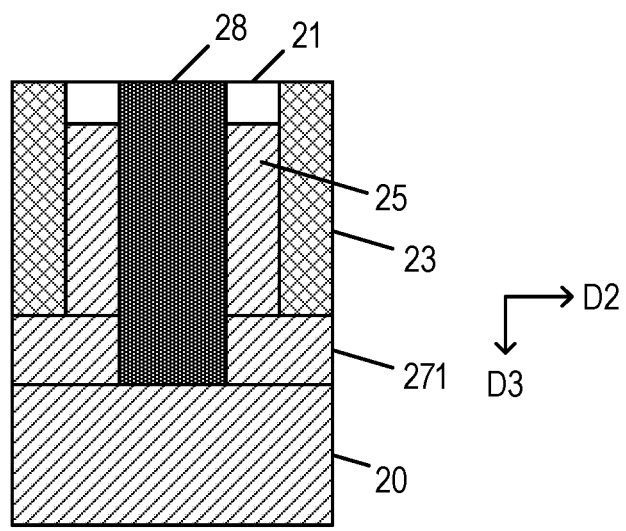
Figure 2K:
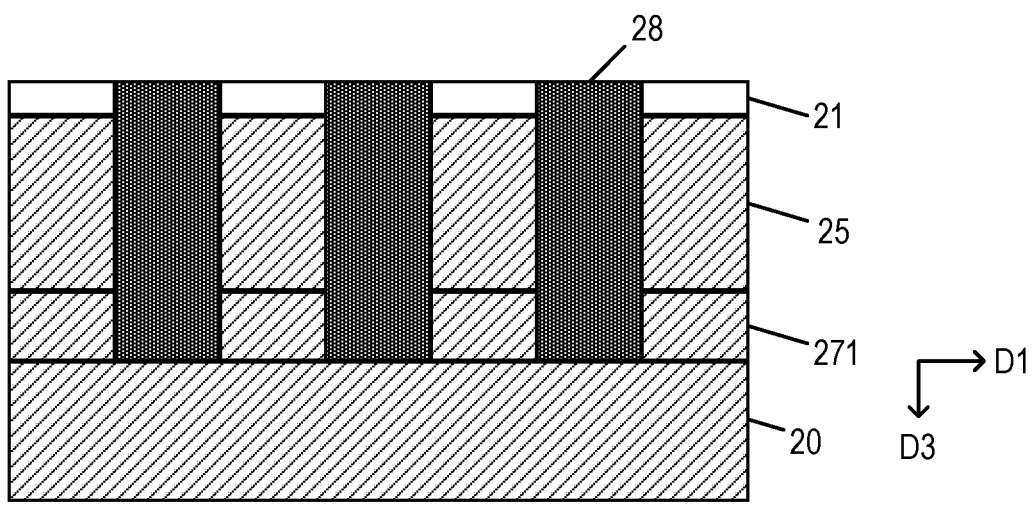
Figure 2L:
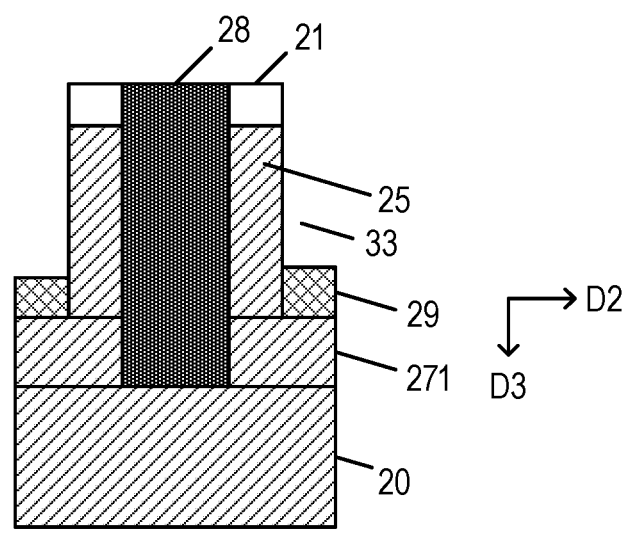
Figure 2M:
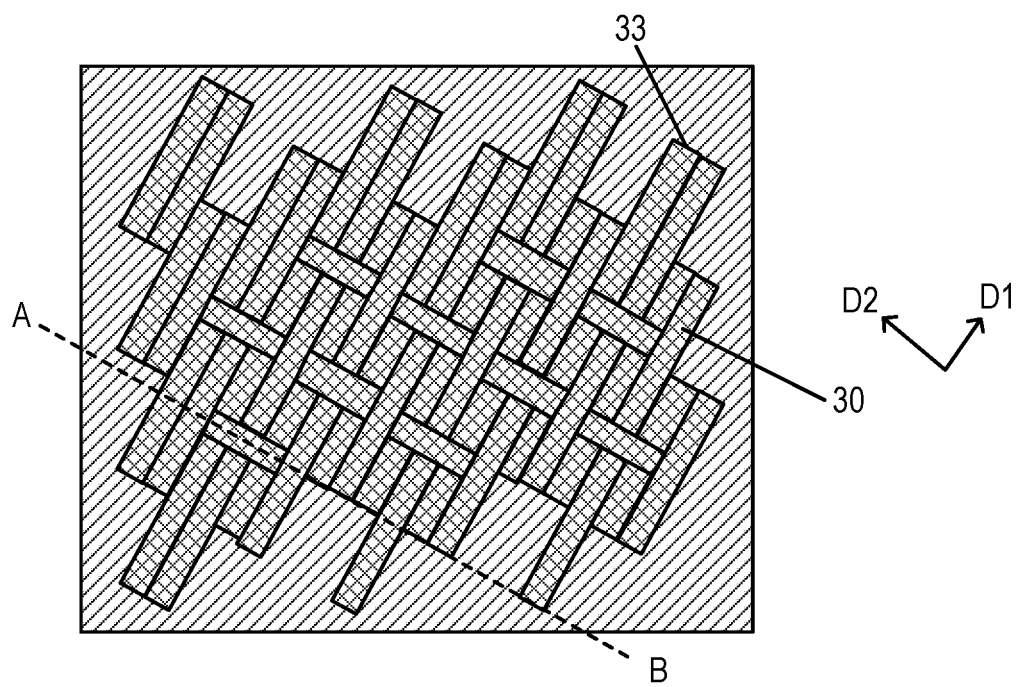
Figure 2N:
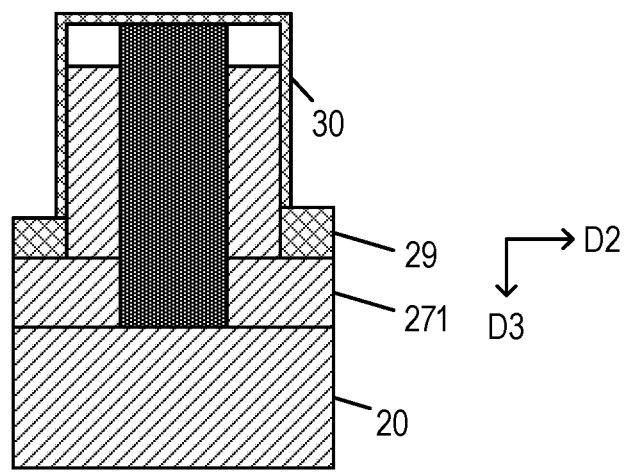
Figure 2O:
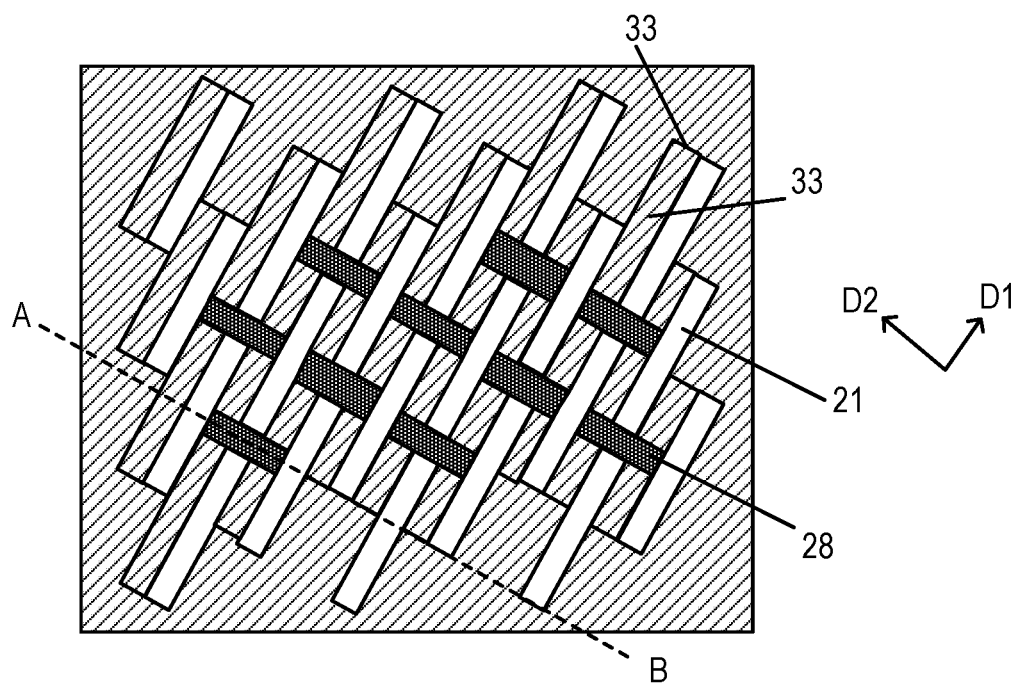
Figure 2P:
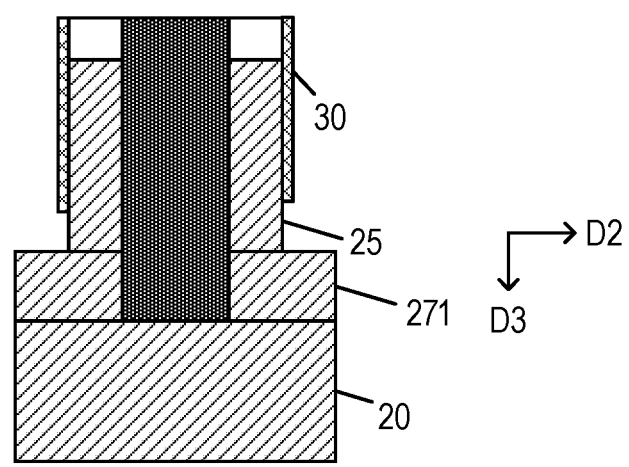
Figure 2Q:
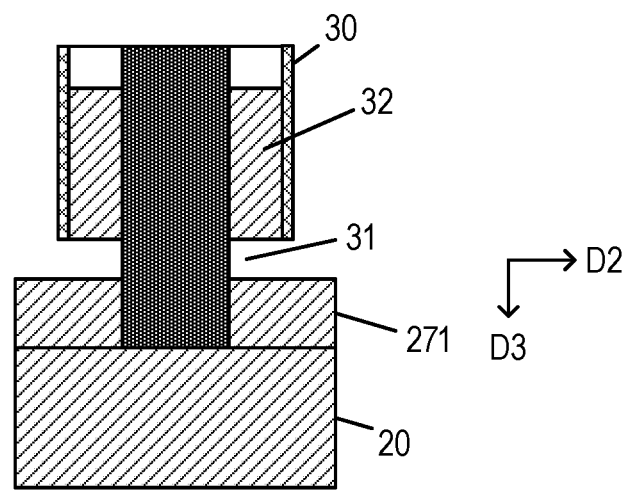

An implementation provides a semiconductor structure. FIG. 1 illustrates a flow diagram of a method for forming the semiconductor structure in the implementation of the disclosure, and FIGS. 2A to 2X illustrate schematic diagrams of main process sections in forming the semiconductor structure in the implementation of the disclosure. As shown in FIG. 1 and FIGS. 2A to 2X, the method for forming the semiconductor structure in the implementation includes the following operations.

At S11, a substrate 20 is provided, as shown in FIG. 2A.

Specifically, the substrate 20 may be, but is not limited to, a silicon substrate. In the present specific embodiment, a silicon substrate used as the substrate 20 is taken as an example for illustration. According to other embodiments, the substrate 20 may be a semiconductor substrate such as gallium nitride substrate, gallium arsenide substrate, gallium carbide substrate, silicon carbide substrate or SOI substrate.

Figure 2R:
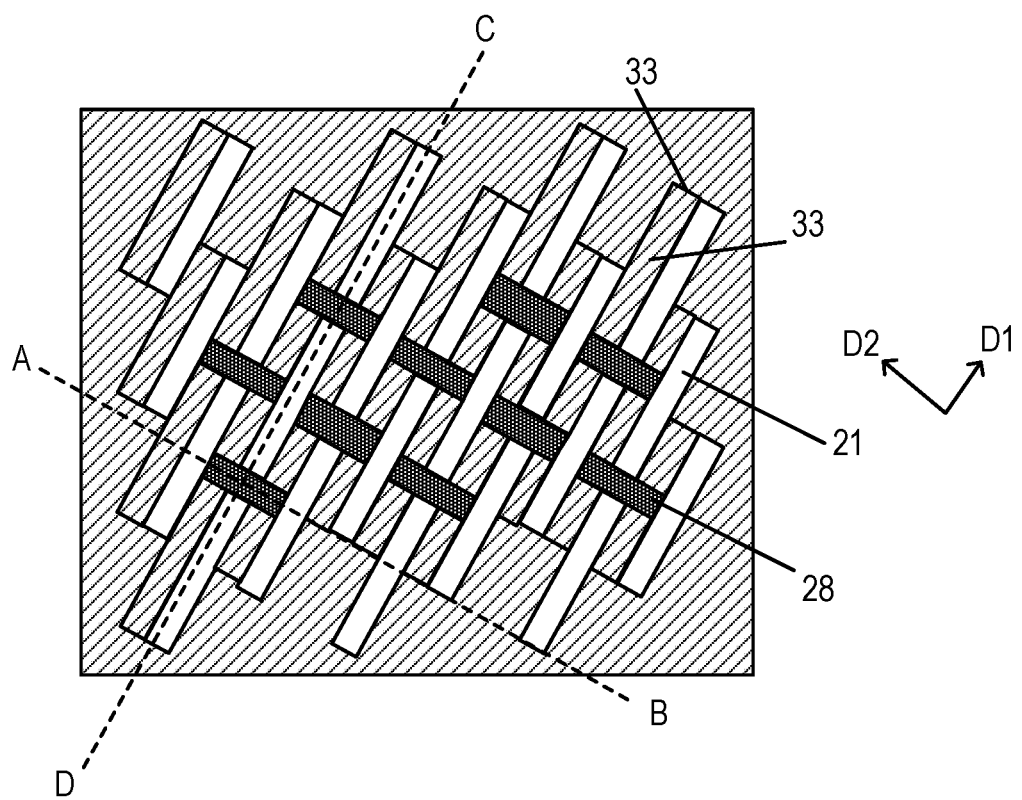
Figure 2S:
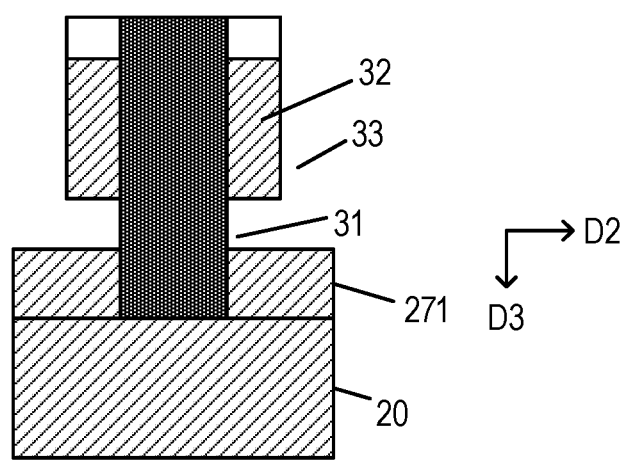
Figure 2T:
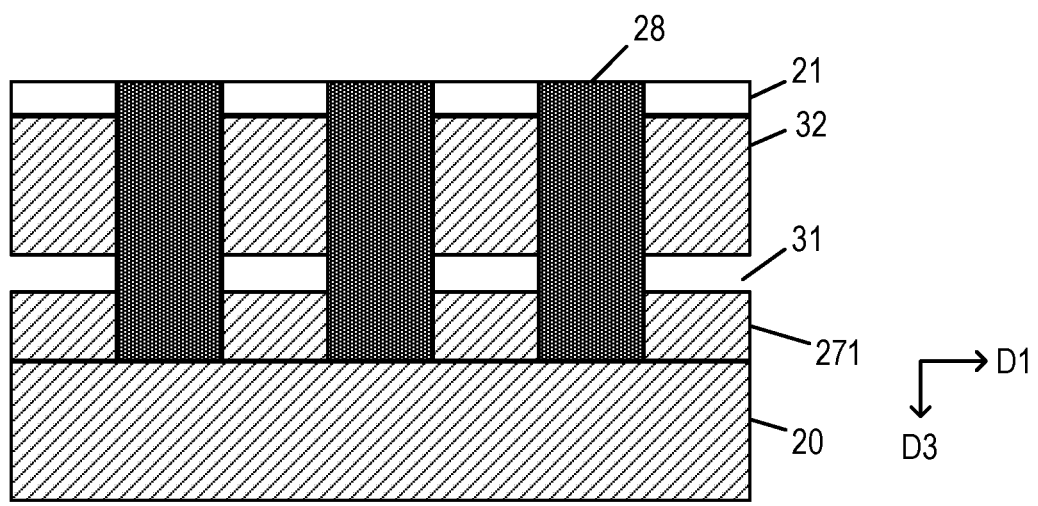
Figure 2U:
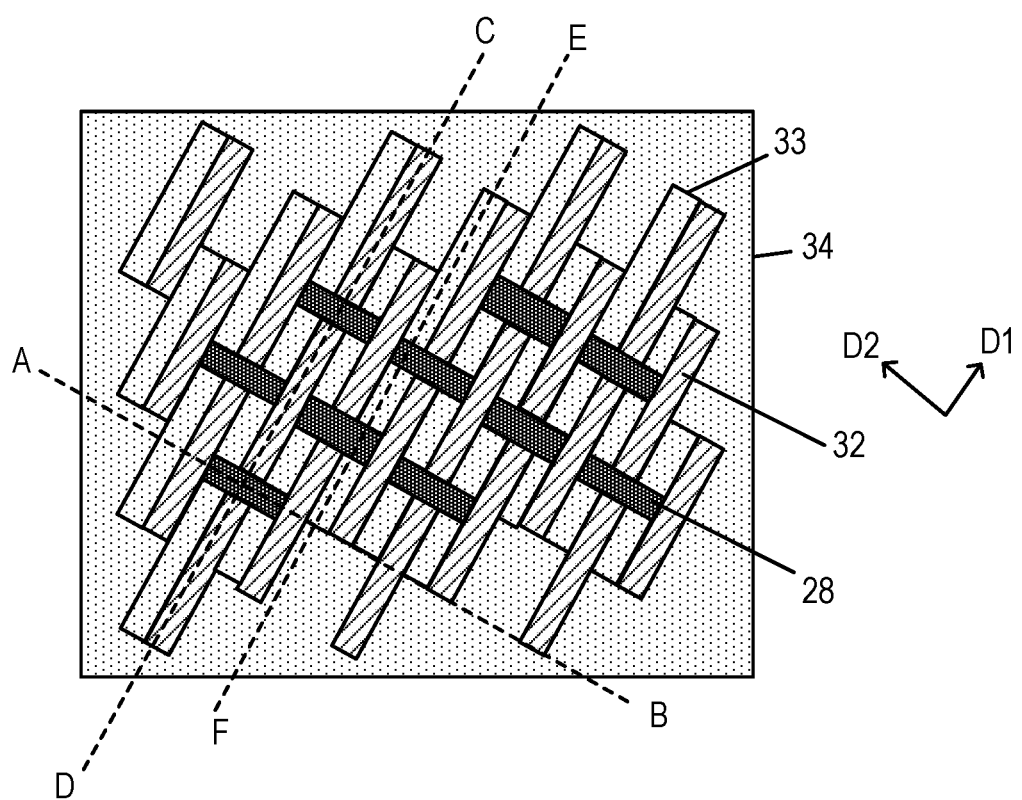

At S12, the substrate 20 is etched to form multiple active areas 32, trenches 33 each positioned between adjacent active areas, and air gaps 31 positioned below the active areas 32, as shown in FIG. 2R, FIG. 2S, and FIG. 2T. FIG. 2S illustrates a sectional schematic diagram of FIG. 2R along the AB direction, and FIG. 2T illustrates a sectional schematic diagram of FIG. 2R along the CD direction.

According to some embodiments, forming the multiple active areas 32, the trenches 33 each positioned between adjacent active areas 32, and the air gaps 31 positioned below the active areas 32 specifically include the following operations.

A mask layer 21 covering the substrate 20 and provided with openings 211 exposing the substrate 20 is formed, as shown in FIG. 2A.

The substrate 20 is etched along the openings 211, to form multiple first initial active areas 22, each extending along a first direction D1, and arranged in parallel along a second direction D2, where the first direction D1 and the second direction D2 are both parallel to a surface of the substrate 20, the first direction D1 intersects the second direction D2, and there are provided first grooves 221 each positioned between adjacent first initial active areas 22, as shown in FIG. 2B.

The first initial active areas 22 are etched to form second grooves 26 and second initial active areas 25 extending along the first direction D1, as shown in FIG. 2E and FIG. 2F, which illustrates a schematic structural diagram from top view of FIG. 2E.

Lower portions of the second initial active areas 25 are removed to form the active areas 32 and the air gaps 31 positioned below the active areas 32, as shown in FIG. 2R, FIG. 2S, and FIG. 2T.

Specifically, a material such as polysilicon may be deposited on the surface of the substrate 20 by Chemical Vapor Deposition (CVD), Physical Vapor Deposition (PVD), or Atomic Layer Deposition (ALD) to form the mask layer 21, and multiple openings 211 exposing the substrate 20 may be formed in the mask layer 21 by patterning the mask layer 21. Then, the substrate 20 is etched downward along the openings 211 to a preset depth through a dry etching process to form the first grooves 221. A first initial active area 22 is formed between two adjacent first grooves 221. The multiple first grooves 221 divide the substrate 20 into multiple first initial active areas 22. The multiple first initial active areas 22 and the multiple first grooves 221 both extend along the first direction D1, and the multiple active areas are arranged in parallel along the second direction D2 intersecting the first direction D1, as shown in FIG. 2B. The first direction D1 and the second direction D2 are both parallel to the surface of the substrate 20, and the first direction D1 obliquely or perpendicularly intersects the second direction D2. In etching the substrate 20, one or a mixture of at least two of $SF_6$, $CF_4$, $Cl_2$, $CHF_3$, $O_2$ or Ar may be adopted as an etching gas.

According to some embodiments, before etching first initial active areas 22, the method further includes the following operation.

A dielectric material is deposited on the substrate 20 to form a first dielectric layer 23 fully filling each of the first grooves 221, as shown in FIG. 2C.

Specifically, Low Pressure Chemical Vapor Deposition (LPCVD) or ALD may be adopted to deposit a material such as silicon nitride on the substrate 20 by using $SiH_4$ or $SiH_2Cl_2$ as a reaction gas, to form the first dielectric layer 23. In forming the first dielectric layer 23 through the ALD process, the reaction gas may further include $NH_3$ or a mixed gas including $N_2$ and $H_2$. The top surface of the first dielectric layer 23 is flush with the top surface of the mask layer 21 by planarization treatment, such as, by Chemical Mechanical Polishing (CMP), as shown in FIG. 2C. The term of "multiple" according to the embodiments refers to two or more.

According to some embodiments, forming the second grooves 26 and the second initial active areas 25 extending along the first direction D1 specifically include the following operation.

The mask layer 21, the first initial active areas 22 and the first dielectric layer 23 are etched, to form multiple second grooves 26 extending through the mask layer 21, the first initial active areas 22 and the first dielectric layer 23 along a direction perpendicular to the substrate 20, where several of the second grooves 26 divide one first initial active area 22 into multiple second initial active areas 25.

According to some embodiments, along the second direction D2, each of the second grooves 26 extends though the first dielectric layer 23 positioned between two adjacent first initial active areas 22.

Specifically, a photoresist layer provided with etching windows 24 is formed on the first dielectric layer 23 and the mask layer 21, as shown in FIG. 2D. The mask layer 21, the first initial active areas 22 and the first dielectric layer 23 are etched downward along the etching windows 24 to form the second grooves 26 extending through the mask layer 21, the first initial active areas 22 and the first dielectric layer 23 along a direction perpendicular to the surface of the substrate 20 (e.g. a third direction D3 as shown in FIG. 2E). The multiple second grooves 26 arranged along the first direction D1 divide one first initial active area 22 into multiple second initial active areas 25 arranged in parallel along the first direction D1. On the one hand, the first dielectric layer 23 can avoid collapse occurred in etching the first initial active areas 22, and ensure the smooth progress of the semiconductor manufacturing. On the other hand, by selective etching, the first dielectric layer 23 can further ensure the stability of the feature dimension of the second grooves 26 and avoid the inclination of the second grooves 26. The second groove 26 formed in the operation extends through the first dielectric layer 23 positioned between two adjacent first initial active areas 22 along the second direction D2, i.e. the second groove 26 extends through two adjacent first grooves 221 along the second direction D2.

According to some embodiments, before removing the lower portions of the second initial active areas 25, the method further includes the following operations.

The substrate 20 is continuously etched downward along second grooves 26 to form third grooves 27 below the second grooves 26, the multiple third grooves 27 being configured to divide the substrate 20 into multiple bearing parts 271, as shown in FIG. 2G.

Support layers 28 fully filling the second grooves 26 and the third grooves 27 are formed, as shown in FIG. 2H, FIG. 2I, FIG. 2J and FIG. 2K. FIG. 2I illustrates a schematic structural diagram from top view of FIG. 2H, FIG. 2J illustrates a sectional schematic diagram along the AB direction in FIG. 2I, and FIG. 2K illustrates a sectional schematic diagram along the CD direction in FIG. 2I.

Specifically, after forming the second grooves 26, the substrate 20 may be continuously etched downward along the second grooves 26 through a vertical dry etching process, so that the third grooves 27 communicating with the second grooves 26 are formed below the second grooves 26. The third grooves 27 divide the substrate 20 into multiple bearing parts 271 each configured to support the first dielectric layer 23 and the second initial active area 25 thereon, as shown in FIG. 2G. Then, an ALD process may be adopted to deposit silicon dioxide in the second groove 26 and the third groove 27 by using LTO520 (aminosilane gas)/$O_2$ or N zero/$O_2$ as a reaction gas to form the support layer 28. Due to the fact that the second groove 26 extends though the first dielectric layer 23 positioned between two adjacent first initial active areas 22, the support layer 28 is connected with two second initial active areas 25 arranged along the second direction D2, and the height of the support layer 28 is larger than that of the second initial active area 25, thereby effectively avoiding the collapse of the second initial active area 25 during the subsequent process. The bottom surface of the support layer 28 is flush with the bottom surface of the bearing part 271.

According to some embodiments, a depth of each of the third grooves 27 is ⅕ to ¼ of that a depth of each of the second initial active areas 25.

The depth of the third groove 27 refers to the height of the third groove 27 along a direction perpendicular to the substrate 20 (e.g. a third direction D3 as shown in FIG. 2G); and the depth of the second initial active area 25 refers to the height of the second initial active area 25 along a direction perpendicular to the substrate 20 (e.g. the third direction D3 as shown in FIG. 2G).

According to some embodiments, removing the lower portions of the second initial active areas 25 specifically includes the following operations.

A portion of the first dielectric layer 23 is removed to form trenches 33 each positioned between adjacent second initial active areas 25, the rest of the first dielectric layer 23 serving as an adjustment layer 29, as shown in FIG. 2L.

A second dielectric layer 30 covering a surface of each of the second initial active areas 25 and a surface of the mask layer 21 is formed, as shown in FIG. 2M and FIG. 2N, which illustrates a sectional schematic diagram of FIG. 2M along the AB direction.

The adjustment layer 29 and the second dielectric layer 30 positioned on a top surface of the mask layer 21 are removed to expose the lower portions of the second initial active areas 25.

The exposed lower portions of the second initial active areas 25 are removed to form active areas 32 and air gaps 31 between the active areas 32 and bearing parts 271, as shown in FIG. 2R, FIG. 2S, and FIG. 2T.

Specifically, after forming the support layers 28, a partial height of the first dielectric layer 23 is removed through vertical and downward etching, and the rest first dielectric layer 23 on the surface of the bearing part 271 serves as the adjustment layer 29, as shown in FIG. 2L. The height of the adjustment layer 29 may be adjusted by controlling the etching time, etchant flow rate and other parameters in the etching process, and the height of the adjustment layer 29 determines the height of the air gap 31 formed subsequently.

Then, the second dielectric layer 30 covering the surface of each of the second initial active areas 25 and the surface of the mask layer 21 is formed. The material for forming the second dielectric layer 30 may be, but is not limited to, a nitride material, for example, silicon nitride. Illustratively, the material for forming the first dielectric layer 23 and the material for forming the second dielectric layer 30 are both silicon nitride. The operation of forming the second dielectric layer 30 includes: performing plasma nitriding on the surface of the mask layer 21 and side walls of the second initial active areas 25 and forming the second dielectric layer 30 covering the surface of the mask layer 21 and the side walls of the second initial active areas 25, as shown in FIG. 2M and FIG. 2N. In plasma nitriding, the used reaction gas may be $NH_3$, the reaction temperature may be 600° C. to 800° C., the RF power may be 600 W to 2000 W, and the reaction pressure may be 1 Pa to 10 Pa.

Then, the adjustment layer 29 and the second dielectric layer 30 are etched downward along the direction perpendicular to the surface of the substrate 20. Due to the blocking of the mask layer 21, only the second dielectric layer 30 on the top surface of the mask layer 21 is removed, and the second dielectric layer 30 covering the side surfaces of the second initial active areas 25 are retained. The entire adjustment layer 29 is removed, therefore the lower portions of the second initial active areas 25 are exposed, as shown in FIG. 2O and FIG. 2P, which illustrates a sectional schematic diagram of FIG. 2O along the AB direction.

Then, the exposed lower portions of the second initial active areas 25 are removed through a wet etching process to form the active areas 32 and the air gaps 31 below the active areas 32, as shown in FIG. 2Q. The air gaps 31 are positioned between the active areas 32 and the bearing parts 271. Then, the second dielectric layer 30 is removed through a wet etching process to obtain a structure as shown in FIG. 2R, FIG. 2S, and FIG. 2T. The forming of the air gap 31 makes the active area 32 suspended and thus electrons from adjacent active areas are prevented from interfering with the active areas 32 from the bottom. The active area 32 is supported by the support layer 28, therefore collapse is avoided. The support layer 28 is supported by the bearing part 271, thereby further improving the stability of the support layer 28. During wet etching of the exposed lower portions of the second initial active areas 25, corrosion in other regions of the substrate 20 would not be caused, because a natural oxide layer is formed on the upper surface of the substrate 20 due to natural oxidation.

To further improve the blocking effect of the air gaps 31 on electron transfer, thereby avoiding affecting the overall stability of the semiconductor structure, a height of the adjustment layer 29 is $1/10$ to $1/8$ of a height of each of the second initial active areas 25 according to some embodiments.

Figure 2V:
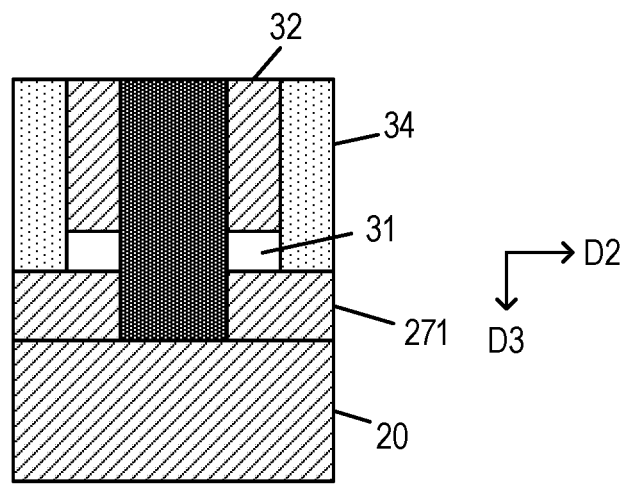
Figure 2W:
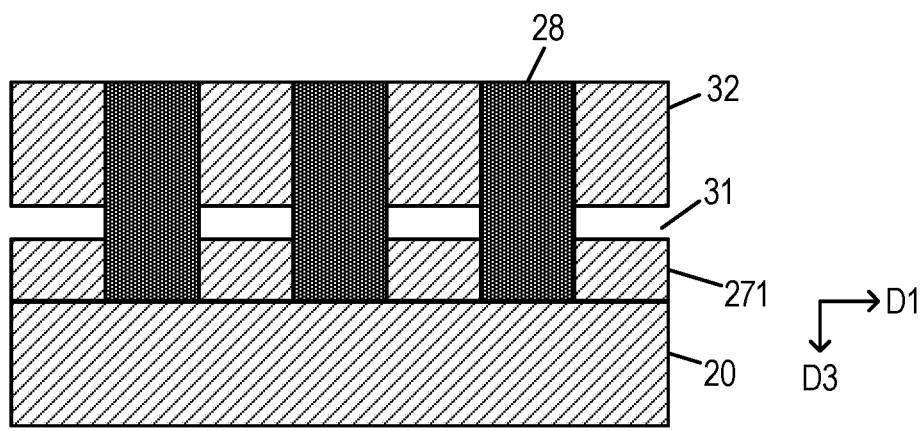
Figure 2X:
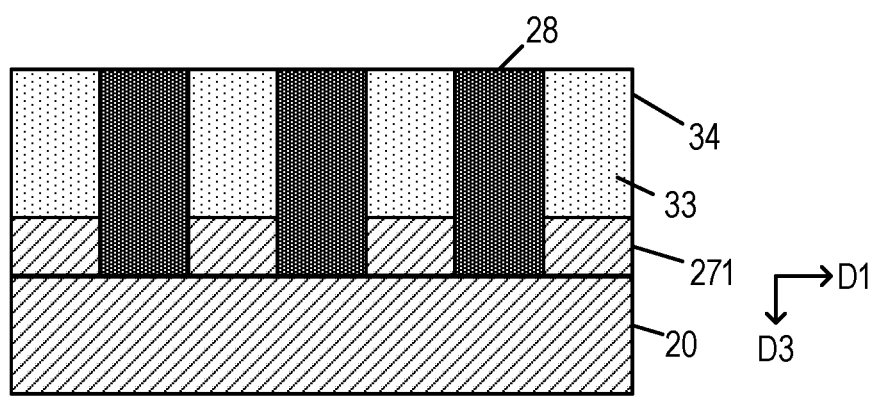

At S13, a filler layer 34 filling at least each of the trenches 33 is formed, as shown in FIG. 2U, FIG. 2V, FIG. 2W and FIG. 2X. FIG. 2V illustrates a sectional schematic diagram of FIG. 2U along the AB direction, FIG. 2W illustrates a sectional schematic diagram of FIG. 2V along the CD direction, and FIG. 2X illustrates a sectional schematic diagram of FIG. 2V along the EF direction.

According to some embodiments, before forming the filler layer 34 filling at least each of the trenches 33, the method further includes the following operation.

The mask layer 21 and the second dielectric layer 30 are removed.

According to some embodiments, forming the filler layer 34 filling at least each of the trenches 33 specifically includes the following operation.

An insulating material is deposited in each of the trenches 33 through an ALD process to form the filler layer 34.

Specifically, the filler layer 34 fully fills the gap (i.e. the trench 33) between adjacent active areas 32. The material for forming the filler layer 34 may be, but is not limited to, an oxide material, for example, silicon dioxide. When the material for forming the filler layer 34 is silicon dioxide, the ALD process may be adopted with LTO520 (aminosilane gas)/$O_2$ or N zero/$O_2$ as a reaction gas.

According to some embodiments, the filler layer 34 is made of the same material as the support layer 28. For example, the filler layer 34 and the support layer 28 are both made of silicon dioxide.

Figure 3A:
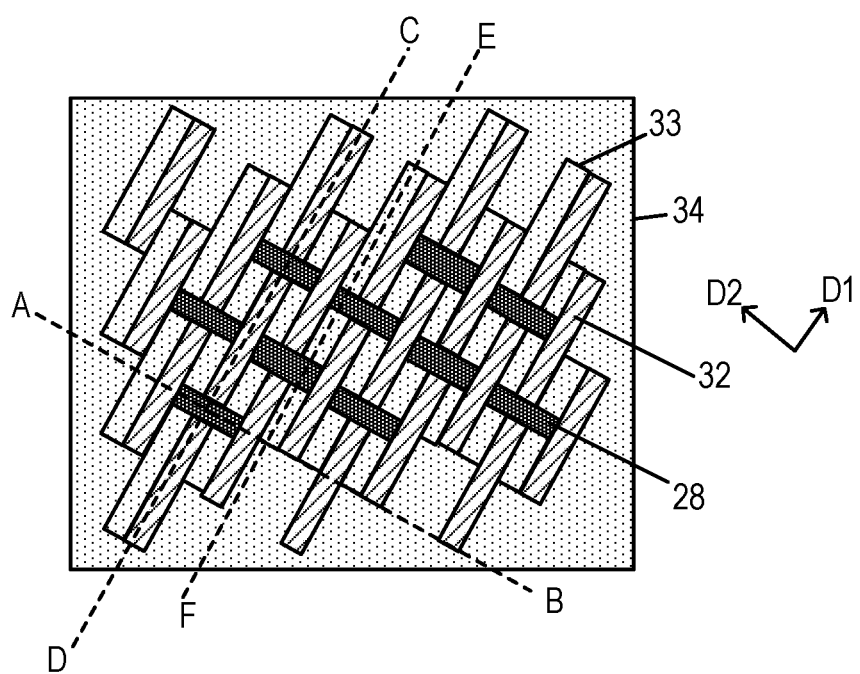
FIGS. 3A to 3D illustrate schematic diagrams of a semiconductor structure in a specific implementation of the disclosure.
Figure 3B:
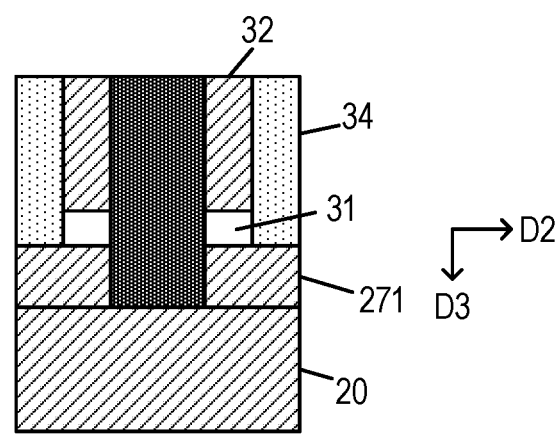
Figure 3C:
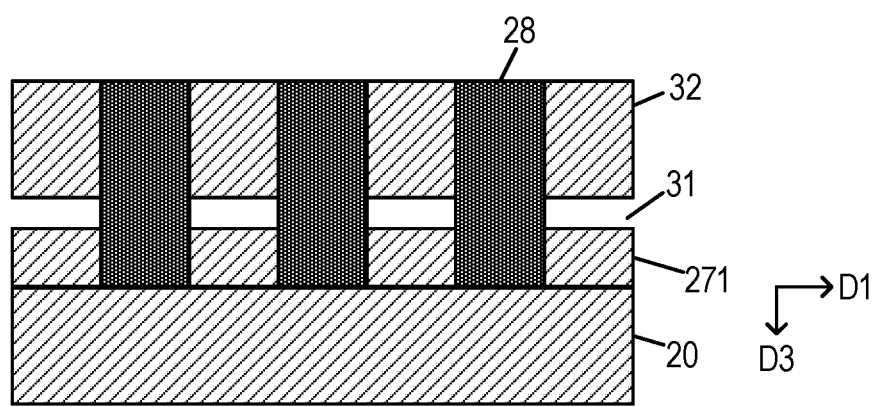
Figure 3D:
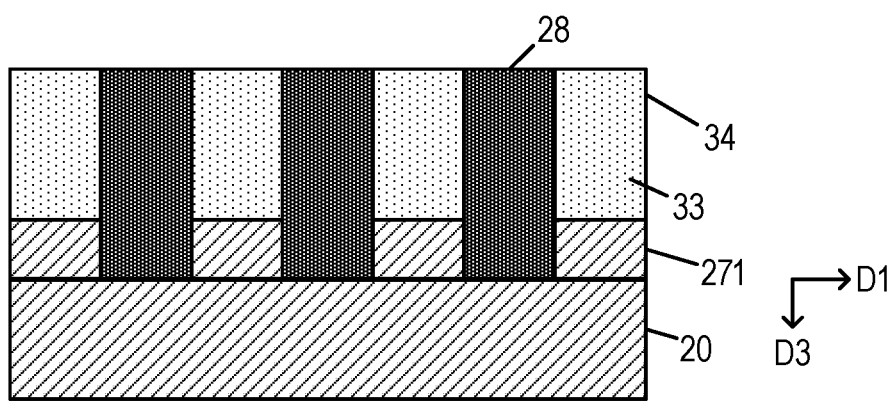

Further, an implementation further provides a semiconductor structure. FIGS. 3A to 3D illustrate schematic diagrams of the semiconductor structure in the implementation of the disclosure. FIG. 3B illustrates a sectional schematic diagram of FIG. 3A along the AB direction, FIG. 3C illustrates a sectional schematic diagram of FIG. 3A along the CD direction, and FIG. 3D illustrates a sectional schematic diagram of FIG. 3A along the EF direction. The semiconductor structure in the implementation may be formed by the method for forming the semiconductor structure as shown in FIG. 1 and FIGS. 2A to 2X. As shown in FIGS. 2A to 2X and FIGS. 3A to 3D, the semiconductor structure includes: a substrate 20; multiple active areas 32; air gaps 31; and a filler layer 34.

The multiple active areas 32 are positioned on the substrate 20. There are provided trenches 33 each positioned between adjacent active areas 32.

The air gaps 31 are positioned below the active areas 32. The filler layer 34 fills each of the trenches 33.

According to some embodiments, a height of each of the air gaps 31 is $1/10$ to $1/8$ of a height of each of the trenches 33.

According to some embodiments, each of the active areas 32 is provided with a respective one of the air gaps 31 below it and each of the active areas 32 is in direct contact with the respective one of the air gaps 31 below it.

According to some embodiments, a sectional dimension of each of the air gaps 31 is the same as a sectional dimension of each of the active areas 32 along a direction parallel to a surface of the substrate 20.

According to some embodiments, the multiple active areas 32 are arranged along a first direction D1 and a second direction D2 to form an active area array. Both the first direction D1 and the second direction D2 are parallel to the surface of the substrate 20, and the first direction D1 intersects the second direction D2.

The semiconductor structure further includes: support layers 28 each positioned between two adjacent active areas 32 arranged in parallel along the first direction D1 and configured to isolate adjacent active areas 32.

According to some embodiments, a bottom surface of each of the support layers 28 is lower than a bottom surface of each of the trenches 33.

According to some embodiments, each of the support layers 28 extends through the filler layer 34 positioned between two adjacent active areas 32 along the second direction D2.

According to some embodiments, the material for forming the support layer 28 is the same as the material for forming the filler layer 34.

According to some embodiments, the semiconductor structure further includes: multiple bearing parts 271, positioned on the surface of the substrate 20, where the multiple active areas 32 are positioned above the multiple bearing parts 271 respectively, and air gaps 31 are positioned between the active areas 32 and the bearing parts 271.

According to some embodiments, each of the support layers 28 is positioned between two adjacent bearing parts 271 and is directly contacted with and connected with the bearing parts 271.

Specifically, the surface of the substrate 20 is further provided with the bearing parts 271, the active areas 32 are positioned above the bearing parts 271, and the air gaps 31 are positioned between the bearing parts 271 and the active areas 32. Each of the support layers 28 is positioned between two adjacent bearing parts 271, and is directly contacted with and connected with the bearing parts 271. The bearing parts 271 are configured to support the support layers 28 to further improve the stability of the support layers 28.

According to the semiconductor structure and the method for forming the same provided by the specific implementations, by forming the air gaps below the active areas, and by utilizing the characteristic that air has relatively low dielectric constant, the interference of electrons from the bottom on the active areas is effectively blocked, the interference between adjacent active areas during operation of the semiconductor structure is reduced, the impact of the row hammer effect is reduced, and the yield and performance reliability of the semiconductor structure are improved.

The foregoing is merely a description of preferred implementations of the disclosure, and it should be noted that those of ordinary skill in the art may make improvements and modifications without departing from the principles of the disclosure, which shall fall within the scope of the disclosure.

The invention claimed is:
1. A method for forming a semiconductor structure, comprising:
  providing a substrate;
  etching the substrate to form a plurality of active areas, trenches each positioned between adjacent active areas, and air gaps positioned below the active areas; and
  forming a filler layer filling at least each of the trenches;
  wherein
  the forming a plurality of active areas, trenches each positioned between adjacent active areas, and air gaps positioned below the active areas comprises:
  forming a mask layer covering the substrate and provided with openings exposing the substrate;
  etching the substrate along the openings, to form a plurality of first initial active areas, each extending along a first direction, and arranged in parallel along a second direction, wherein the first direction and the second direction are both parallel to a surface of the substrate, the first direction intersects the second direction, and there are provided first grooves each positioned between adjacent first initial active areas;
  etching the first initial active areas to form second grooves and second initial active areas extending along the first direction; and
  removing lower portions of the second initial active areas to form the active areas and the air gaps positioned below the active areas.

2. The method for forming the semiconductor structure of claim 1, before etching the first initial active areas, further comprising:
  depositing a dielectric material on the substrate to form a first dielectric layer fully filling each of the first grooves.

3. The method for forming the semiconductor structure of claim 2, wherein
  the forming second grooves and second initial active areas extending along the first direction comprises:
  etching the mask layer, the first initial active areas and the first dielectric layer, to form the second grooves extending through the mask layer, the first initial active areas and the first dielectric layer along a direction perpendicular to the substrate, wherein several of the second grooves divide one of the first initial active areas into the second initial active areas.

4. The method for forming the semiconductor structure of claim 3, wherein
  along the second direction, each of the second grooves extends through the first dielectric layer positioned between two adjacent first initial active areas.

5. The method for forming the semiconductor structure of claim 3, before removing lower portions of the second initial active areas, further comprises:
  etching continuously the substrate downward along the second grooves, to form third grooves below the second grooves, wherein the third grooves are configured to divide the substrate into a plurality of bearing parts; and
  forming support layers fully filling the second grooves and the third grooves.

6. The method for forming the semiconductor structure of claim 5, wherein
  a depth of each of the third grooves is $\frac{1}{5}$ to $\frac{1}{4}$ of a depth of each of the second initial active areas.

7. The method for forming the semiconductor structure of claim 5, wherein
  the removing the lower portions of the second initial active areas comprises:
  removing a portion of the first dielectric layer to form trenches each positioned between adjacent second initial active areas, the rest of the first dielectric layer serving as an adjustment layer;

forming a second dielectric layer covering a surface of each of the second initial active areas and a surface of the mask layer;

removing the adjustment layer and the second dielectric layer positioned on a top surface of the mask layer to expose the lower portions of the second initial active areas; and removing the exposed lower portions of the second initial active areas to form the active areas and the air gaps between the active areas and the bearing parts.

8. The method for forming the semiconductor structure of claim 7, wherein
a height of the adjustment layer is 1/10 to 1/8 of a height of each of the second initial active areas.

9. The method for forming the semiconductor structure of claim 7, before the forming a filler layer filling at least each of the trenches, further comprises:
removing the mask layer and the second dielectric layer.

10. The method for forming the semiconductor structure of claim 9, wherein
the forming a filler layer filling at least each of the trenches comprises:
depositing an insulating material in each of the trenches through an atomic layer deposition process to form the filler layer.

11. A semiconductor structure, comprising:
a substrate;
a plurality of active areas positioned on the substrate, wherein there are provided trenches each positioned between adjacent active areas;
air gaps positioned below the active areas; and
a filler layer filling each of the trenches;
wherein
a sectional dimension of each of the air gaps is same as a sectional dimension of each of the active areas along a direction parallel to a surface of the substrate;
wherein
the plurality of active areas are arranged in a first direction and a second direction to form an active area array, the first direction and the second direction are both parallel to the surface of the substrate, and the first direction intersects the second direction; and wherein the semiconductor structure further comprises:
support layers, each positioned between two adjacent active areas arranged in parallel along the first direction, and configured to isolate the adjacent active areas.

12. The semiconductor structure of claim 11, wherein
a height of each of the air gaps is 1/10 to 1/8 of a height of each of the trenches.

13. The semiconductor structure of claim 11, wherein
each of the active areas is provided with a respective one of the air gaps below it and each of the active areas is in direct contact with the respective one of the air gaps below it.

14. The semiconductor structure of claim 11, wherein
a bottom surface of each of the support layers is lower than a bottom surface of each of the trenches.

15. The semiconductor structure of claim 11, wherein,
along the second direction, each of the support layers extends through the filler layer positioned between two adjacent active areas.

16. The semiconductor structure of claim 11, further comprising:
a plurality of bearing parts, positioned on the surface of the substrate, wherein the plurality of the active areas are positioned above the plurality of bearing parts respectively, and the air gaps are positioned between the active areas and the bearing parts.

17. The semiconductor structure of claim 16, wherein
each of the support layers is positioned between two adjacent bearing parts and is directly contacted and connected with the bearing parts.

* * * * *